US012446144B2

United States Patent
Miki et al.

(10) Patent No.: US 12,446,144 B2
(45) Date of Patent: Oct. 14, 2025

(54) CIRCUIT BOARD MODULE (71) Applicant: Murata Manufacturing Co., Ltd., Kyoto-fu (JP)

(72) Inventors: Osamu Miki, Nagaokakyo (JP); Tatsuya Hosotani, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 163 days.

(21) Appl. No.: 17/933,116

(22) Filed: Sep. 18, 2022

(65) Prior Publication Data

US 2023/0009649 A1      Jan. 12, 2023

Related U.S. Application Data (63) Continuation of application No. PCT/JP2020/043644, filed on Nov. 24, 2020.

(30) Foreign Application Priority Data

Mar. 18, 2020   (JP) .................................. 2020-047121

(51) Int. Cl.
   *H05K 1/02*    (2006.01)
   *H01L 23/367*  (2006.01)
   (Continued)

(52) U.S. Cl.
   CPC ....... *H05K 1/0206* (2013.01); *H01L 23/3675* (2013.01); *H01L 25/16* (2013.01);
   (Continued)

(58) Field of Classification Search
   CPC .... H05K 1/0206; H05K 1/144; H05K 1/0204; H05K 7/209; H05K 7/20472; H05K 2201/042; H05K 2201/1003
   See application file for complete search history.

(56) References Cited

U.S. PATENT DOCUMENTS 5,739,581 A * 4/1998 Chillara .............. H01L 25/0657
                                                257/668
6,118,177 A * 9/2000 Lischner ................. H01L 23/36
                                                257/E23.101
(Continued)

FOREIGN PATENT DOCUMENTS

JP      S61-83098 U1    6/1986
JP      2006-093526 A   4/2006
(Continued)

OTHER PUBLICATIONS

International Search Report issued in PCT/JP2020/043644; mailed Feb. 22, 2021.

*Primary Examiner* — Jayprakash N Gandhi
*Assistant Examiner* — Matthew Sinclair Muir
(74) *Attorney, Agent, or Firm* — Studebaker Brackett PLLC (57) ABSTRACT

A circuit board module includes a first circuit board having a first main surface on which an electronic component that generates heat when the electronic component operates is mounted and a second main surface, a second circuit board having a third main surface on which the first circuit board is mounted and a fourth main surface, and a first thermally-conductive sheet between the first circuit board and the second circuit board. The first circuit board is mounted such that the second main surface faces the third main surface. The first circuit board includes thermally-conductive vias that extend between the first and second main surfaces, the vias being densely distributed in a region near a mounting terminal of the electronic component, filled with a thermally-conductive member, and physically in contact with the first thermally-conductive sheet that covers the third main surface of the second circuit board.

21 Claims, 8 Drawing Sheets

(51) Int. Cl.
*H01L 23/373* (2006.01)
*H01L 25/16* (2023.01)
*H05K 1/14* (2006.01)
*H05K 7/20* (2006.01)

(52) U.S. Cl.
CPC ............ *H05K 1/144* (2013.01); *H05K 7/209* (2013.01); *H01L 23/3737* (2013.01); *H05K 2201/042* (2013.01); *H05K 2201/1003* (2013.01)

(56) References Cited

U.S. PATENT DOCUMENTS

| | | | | |
|---|---|---|---|---|
| 6,933,612 | B2* | 8/2005 | Kimura | H01L 23/49833 |
| | | | | 257/E23.101 |
| 7,623,349 | B2* | 11/2009 | Refai-Ahmed | H05K 7/20445 |
| | | | | 361/708 |
| 7,808,013 | B2* | 10/2010 | Mendendorp, Jr. | H05K 1/0206 |
| | | | | 257/99 |
| 9,209,141 | B2* | 12/2015 | Lamorey | H05K 1/0216 |
| 10,199,904 | B2* | 2/2019 | Sasaki | H05K 1/09 |
| 2011/0001418 | A1* | 1/2011 | Tsai | H05K 1/056 |
| | | | | 313/46 |
| 2015/0373836 | A1* | 12/2015 | Masutani | H01L 25/07 |
| | | | | 361/783 |
| 2020/0395278 | A1* | 12/2020 | Harada | H01L 25/18 |
| 2021/0327783 | A1* | 10/2021 | Song | G06F 1/185 |

FOREIGN PATENT DOCUMENTS

| | | |
|---|---|---|
| JP | 2010-141279 A | 6/2010 |
| JP | 2014-029977 A | 2/2014 |

\* cited by examiner

CIRCUIT BOARD MODULE

CROSS-REFERENCE TO RELATED APPLICATIONS

This application claims benefit of priority to International Patent Application No. PCT/JP2020/043644, filed Nov. 24, 2020, and to Japanese Patent Application No. 2020-047121, filed Mar. 18, 2020, the entire contents of each are incorporated herein by reference.

BACKGROUND

Technical Field

The present disclosure relates to a circuit board module on which an electronic component that generates heat when it operates is mounted.

Background Art

Japanese Unexamined Patent Application Publication No. 2010-141279 describes a circuit component that has a heat-dissipation structure of an element mounted on a substrate. In the configuration described in Japanese Unexamined Patent Application Publication No. 2010-141279, the element is mounted on a mounting surface of the substrate. A through hole is formed in the substrate such that a heat-dissipation portion of the element is exposed through the through hole.

A radiator that includes heat-dissipation fins is mounted on a surface of the substrate that is opposite to the mounting surface of the substrate. The radiator includes a projecting portion. The projecting portion is inserted through the through hole so as to be in surface contact with the heat-dissipation portion of the element.

SUMMARY

However, with a configuration of the related art such as that described in Japanese Unexamined Patent Application Publication No. 2010-141279, it is difficult to reduce the height of a circuit component in a mounted state due to, for example, the height of a heat-dissipation fin.

Accordingly, the present disclosure provides a circuit board module that has a favorable heat-dissipation performance and that is reduced in height.

A circuit board module of the present disclosure includes a first circuit board, a second circuit board, and a first thermally-conductive sheet. The first circuit board has a first main surface and a second surface, and an electronic component that generates heat when it operates is mounted on the first main surface. The second circuit board has a third main surface and a fourth main surface, and the first circuit board is mounted on the third main surface. The first thermally-conductive sheet is disposed between the first circuit board and the second circuit board. The first circuit board is mounted such that the second main surface faces the third main surface of the second circuit board. The first circuit board includes a plurality of thermally-conductive vias that extends between the first main surface and the second main surface. The plurality of thermally-conductive vias are formed in such a manner as to be densely distributed in a region near a mounting terminal of the electronic component and filled with a thermally-conductive member. The plurality of thermally-conductive vias are physically in contact with the first thermally-conductive sheet. The first thermally-conductive sheet covers the third main surface of the second circuit board.

In this configuration, heat generated by the electronic component is transferred, with a high thermal conductivity, to the second circuit board through the thermally-conductive vias and the first thermally-conductive sheet. As a result, the heat generated by the electronic component is effectively dissipated. In this case, it is not necessary to use a radiator having a large height such as that of the related art.

According to the present disclosure, a circuit board module that has a favorable heat-dissipation performance and that is reduced in height can be obtained.

DETAILED DESCRIPTION

First Embodiment

Figure 1:
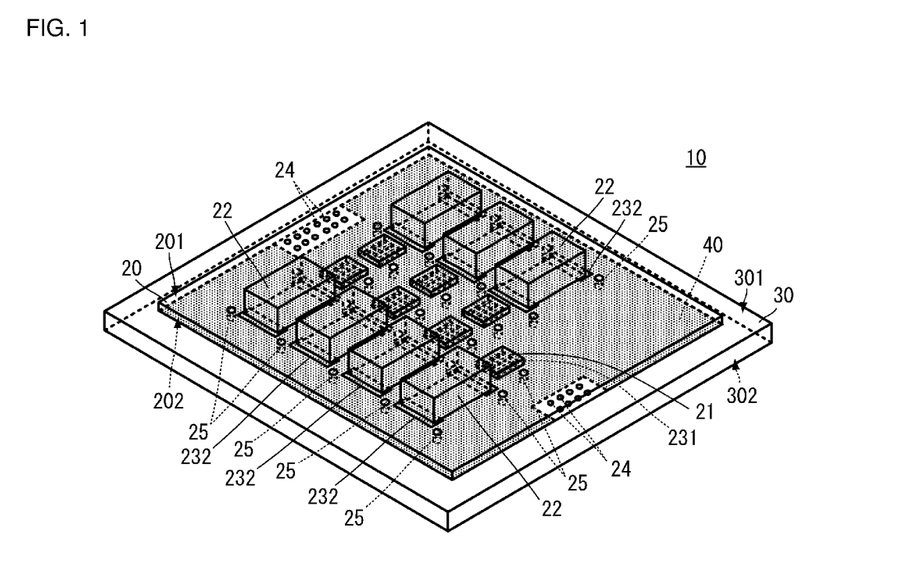
FIG. 1 is an external perspective view of a circuit board module according to a first embodiment.
Figure 2:
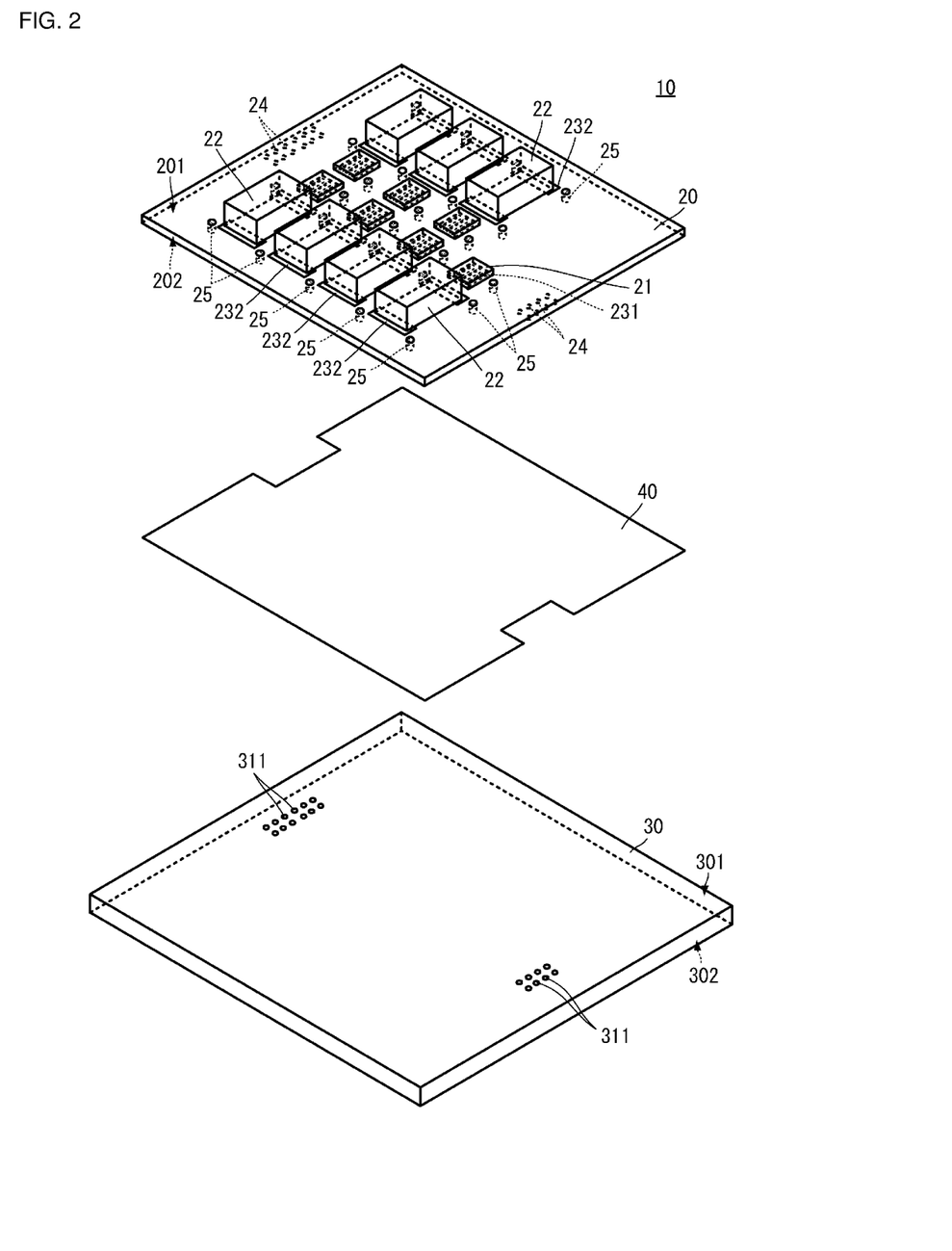
FIG. 2 is an exploded perspective view of the circuit board module according to the first embodiment.
Figure 3:
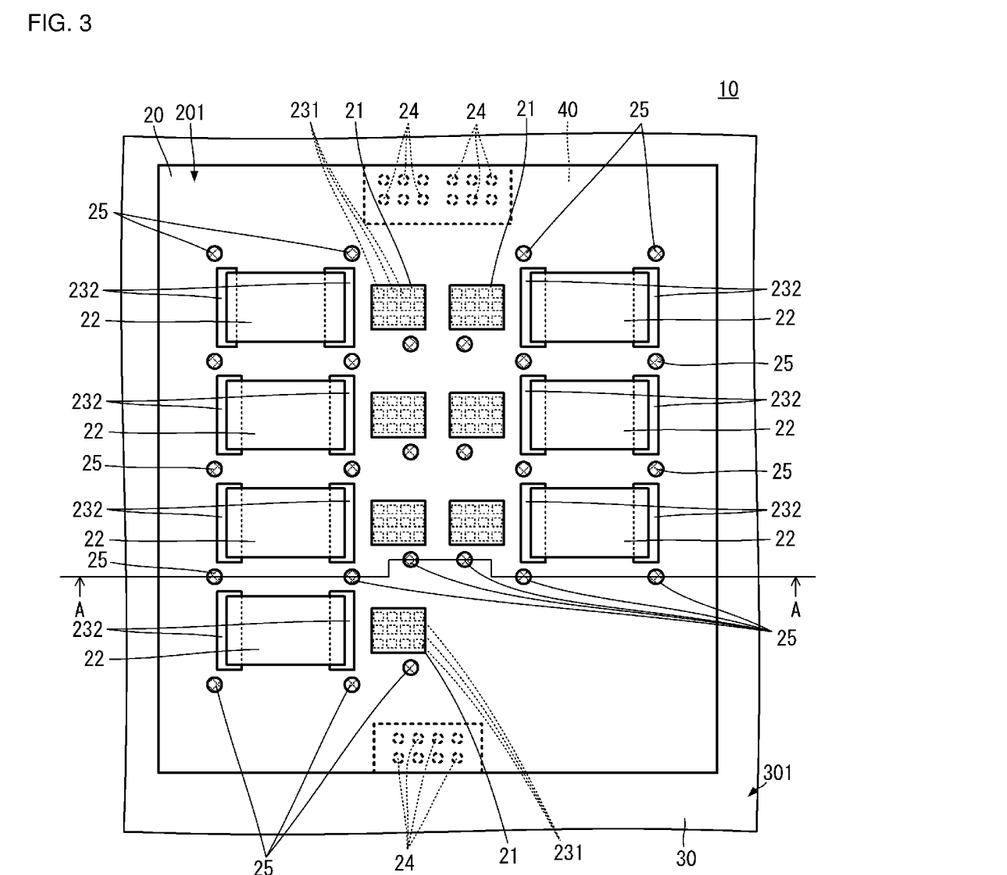
FIG. 3 is a plan view of the circuit board module according to the first embodiment.
Figure 4:
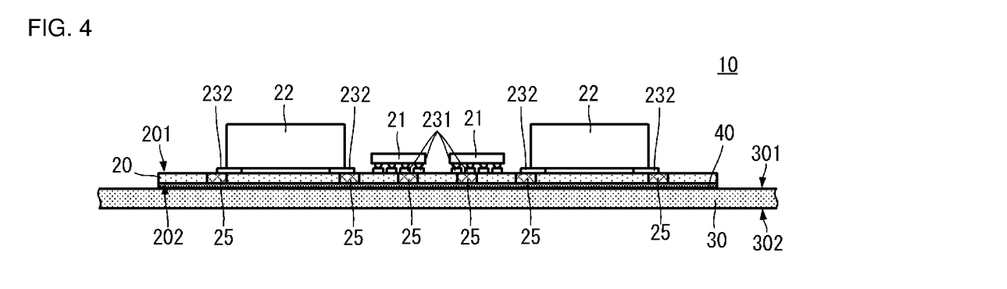
FIG. 4 is a sectional side view of the circuit board module according to the first embodiment.

A circuit board module according to a first embodiment of the present disclosure will be described with reference to the drawings. FIG. 1 is an external perspective view of the circuit board module according to the first embodiment. FIG. 2 is an exploded perspective view of the circuit board module according to the first embodiment. FIG. 3 is a plan view of the circuit board module according to the first embodiment. FIG. 4 is a sectional side view of the circuit board module according to the first embodiment. Note that FIG. 4 is a schematic sectional view taken along line A-A of FIG. 3. Some reference signs are not illustrated in FIG. 1, FIG. 2, FIG. 3, and FIG. 4 in order to make the drawings easy to see.

(Configuration of Circuit Board Module 10)

As illustrated in FIG. 1, FIG. 2, FIG. 3, and FIG. 4, a circuit board module 10 includes a circuit board 20, a circuit board 30, and a thermally-conductive sheet 40.

The circuit board 20 is formed of an insulating substrate. The circuit board 20 is a flat plate having a first main surface 201 and a second main surface 202. Although not illustrated in the drawings, a conductor pattern for fabricating a power conversion circuit, which will be described later, is formed on the circuit board 20. The circuit board 20 corresponds to a "first circuit board" of the present disclosure.

A plurality of switching ICs 21 and a plurality of inductors 22 are mounted on the first main surface 201 of the circuit board 20. The plurality of switching ICs 21 are main "electronic devices that generate heat when they operate" of the present disclosure. Note that the plurality of inductors 22 may be included in the "electronic devices that generate heat when they operate" of the present disclosure. Note that the "electronic devices that generate heat when they operate" of the present disclosure may be power semiconductors.

The plurality of switching ICs 21 are mounted on the circuit board 20 in a predetermined arrangement. The plurality of inductors 22 are mounted on the circuit board 20 in a predetermined arrangement in such a manner as to sandwich the region in which the plurality of switching ICs 21 are arranged. In this case, the plurality of switching ICs 21 and the plurality of inductors 22 are arranged in such a manner that each of the switching ICs 21 and a corresponding one of the inductors 22 forming part of a power converter (see FIG. 4 and FIG. 5) are positioned close to each other. For example, as illustrated in FIG. 1, FIG. 2, and FIG. 3, the plurality of switching ICs 21 and the plurality of inductors 22 are arranged in a central region of the circuit board 20 when the circuit board 20 is viewed in plan view. Note that the plurality of switching ICs 21 and the plurality of inductors 22 are not limited to being arranged in the central region.

A plurality of external terminal conductors 24 are formed on the circuit board 20. Each of the plurality of external terminal conductors 24 is, for example, a conductor pattern having a substantially circular shape, a rectangular shape, or the like and is formed on the second main surface 202 of the circuit board 20. When the circuit board 20 is viewed in plan view, the plurality of external terminal conductors 24 are arranged in a region that is different from the regions in which the plurality of switching ICs 21 and the plurality of inductors 22 are arranged. For example, the plurality of external terminal conductors 24 are arranged in a predetermined pattern in the vicinity of a side surface of the circuit board 20.

A plurality of thermally-conductive vias 25 are formed in the circuit board 20. The plurality of thermally-conductive vias 25 each extend between the first main surface 201 and the second main surface 202 of the circuit board 20. The plurality of thermally-conductive vias 25 are made of a material having a high thermal conductivity such as a predetermined metal or the like. More specifically, the plurality of thermally-conductive vias 25 can be obtained by filling through holes extending between the first main surface 201 and the second main surface 202 of the circuit board 20 with a thermally-conductive member having a high thermal conductivity. For example, each of the plurality of thermally-conductive vias 25 may also serve as a via conductor for fabricating a circuit on the circuit board 20. It is preferable that each of the plurality of thermally-conductive vias 25 have a cross-sectional area larger than that of such a via conductor for fabricating a circuit.

The plurality of thermally-conductive vias 25 are formed in such a manner as to be densely distributed in regions near mounting terminals (conductor patterns) on which the plurality of switching ICs 21 are mounted. Here, the case where the thermally-conductive vias 25 are arranged near the mounting terminals can be defined by, for example, a state where the gap between each of the thermally-conductive vias 25 and the corresponding mounting terminal is smaller than a dimension of the thermally-conductive via 25 or a state where another conductor pattern is not formed between each of the thermally-conductive vias 25 and the corresponding mounting terminal Note that such a definition is an example, and the thermally-conductive vias 25 can be defined as being formed in the vicinity of their respective mounting terminals as long as they are arranged at positions where heat that is transferred from the plurality of switching ICs 21 to the mounting terminals is transferred to the thermally-conductive vias 25 with an efficiency higher than the efficiency with which the heat is transferred to other components through a circuit conductor pattern or a circuit via conductor.

In addition, the plurality of thermally-conductive vias 25 are formed in such a manner as to be densely distributed in regions near the mounting terminals (conductor patterns) on which the plurality of inductors 22 are mounted. The definition of the plurality of thermally-conductive vias 25 being arranged in the vicinity of the mounting terminals for the plurality of inductors 22 is similar to the above definition of the plurality of thermally-conductive vias 25 being arranged in the vicinity of the mounting terminals for the plurality of switching ICs 21, and the description thereof will be omitted.

The circuit board 30 is formed of an insulating substrate. The circuit board 30 is a flat plate having a third main surface 301 and a fourth main surface 302. The circuit board 30 is, for example, a motherboard of an electronic device such as a personal computer. The planar area of the circuit board 30 is larger than the planar area of the circuit board 20, and it is preferable that the planar area of the circuit board 30 be significantly than the planar area of the circuit board 20. The circuit board 30 corresponds to a "second circuit board" of the present disclosure.

A plurality of land conductors 311 are formed on the third main surface 301 of the circuit board 30.

The thermally-conductive sheet 40 is a film having a high thermal conductivity. It is preferable that the thermally-conductive sheet 40 have flexibility. The area of the thermally-conductive sheet 40 is approximately the same as the area of the circuit board 20 (the area of the second main surface 202). The thermally-conductive sheet 40 is formed of, for example, a graphite sheet or a silicone sheet. The thermally-conductive sheet 40 corresponds to a "first thermally-conductive sheet" of the present disclosure. Note that, in the case of using a graphite sheet, it is preferable to use a graphite sheet having a thermal conductivity higher than that of a metal. This further improves a heat dissipation efficiency, which will be described later.

In the circuit board module 10 having a configuration such as that described above, the circuit board 20 is disposed with respect to the circuit board 30 in such a manner that the second main surface 202 faces the third main surface 301 of the circuit board 30. The plurality of land conductors 311 of the circuit board 30 are joined to the plurality of external terminal conductors 24 of the circuit board 20 with a conductive joining material such as solder. As a result, the circuit board 20 and the circuit board 30 are electrically and physically joined to each other.

The thermally-conductive sheet 40 is disposed between the circuit board 20 and the circuit board 30 and is in surface contact with the circuit board 20 and the circuit board 30. In other words, the thermally-conductive sheet 40 covers the second main surface 202 of the circuit board 20 and a portion of the third main surface 301 of the circuit board 30, the portion facing the second main surface 202. In this case, the thermally-conductive sheet 40 is physically in contact with the plurality of thermally-conductive vias 25 of the circuit board 20.

With such a configuration, the circuit board module 10 can transfer heat generated by the plurality of switching ICs 21 to the circuit board 30 through the substrate forming the circuit board 20, a circuit conductor pattern, and the thermally-conductive sheet 40. In addition, the circuit board module 10 can transfer the heat generated by the plurality of switching ICs 21 to the circuit board 30 through the plurality of thermally-conductive vias 25 and the thermally-conductive sheet 40. Since the area of the circuit board 30 is larger than that of the circuit board 20, the transferred heat is effectively dissipated.

In particular, the circuit board module 10 includes the plurality of thermally-conductive vias 25, so that the circuit board module 10 can more effectively transfer the heat generated by the plurality of switching ICs 21 to the thermally-conductive sheet 40. The thermally-conductive sheet 40 is larger than the total area of the plurality of thermally-conductive vias 25, larger than the area in which the plurality of switching ICs 21 are arranged, and larger than the area in which the plurality of inductors 22 are arranged, and thus, the thermally-conductive sheet 40 can further diffuse the heat, which is transferred thereto, in a planar manner and transfer the heat to the circuit board 30. The heat is further diffused by the circuit board 30 having a larger area than the thermally-conductive sheet 40, and more efficient heat dissipation can be achieved.

By employing the above-described configuration, the circuit board module 10 can more effectively dissipate heat generated by an electronic component that generates heat when it operates. In addition, the circuit board module 10 does not use a heat-dissipation fin such as that included in a configuration of the related art, and thus, reduction in the height of the circuit board module 10 can be achieved. In other words, the circuit board module 10 can have a favorable heat-dissipation performance and can be reduced in height.

In the above-described configuration, in the case where the thermally-conductive sheet 40 has flexibility, the thermally-conductive sheet 40 may be sandwiched between the circuit board 20 and the circuit board 30 such that a predetermined pressure is applied to the thermally-conductive sheet 40. The phrase "has flexibility" refers to being capable of being easily deformed by an external force or the like. As a result, the degree of close contact between the thermally-conductive sheet 40 and the circuit board 20 and the degree of close contact between the thermally-conductive sheet 40 and the circuit board 30 are improved. The degree of close contact between the thermally-conductive sheet 40 and the plurality of thermally-conductive vias 25 are also improved. Consequently, the circuit board module 10 can have a higher heat-dissipation performance.

A silicone sheet may be used as the thermally-conductive sheet 40 in order to prevent an unnecessary short-circuit between the circuit board 20 and the circuit board 30. In this case, an insulating resist film that is provided at a portion of the second main surface 202 of the circuit board 20 and a portion of the third main surface 301 of the circuit board 30, the portions facing each other, can be omitted. Even in an aspect in which such an insulating resist film is provided, an unnecessary short-circuit can be further reliably prevented from occurring between the circuit board 20 and the circuit board 30.

On the other hand, when it is not necessary to prevent such a short-circuit, and it is desired to actively bring the thermally-conductive sheet 40 into conduction as in a second embodiment, which will be described later, a graphite sheet may be used as the thermally-conductive sheet 40. In the case of using a graphite sheet, an unnecessary short-circuit can be prevented from occurring between the circuit board 20 and the circuit board 30 by providing an insulating resist film at required positions on the portion of the second main surface 202 of the circuit board 20 and the portion of the third main surface 301 of the circuit board 30, the portions facing each other.

The thermally-conductive sheet 40 is not located in the regions of the circuit board 20 in which the plurality of external terminal conductors 24 are formed. As a result, the possibility of an occurrence of an unnecessary short-circuit can be reduced by using an electrically conductive sheet (e.g., a graphite sheet) as the thermally-conductive sheet 40, and the possibility of an occurrence of breakage of wiring lines can be reduced by using an insulating sheet (e.g., a silicone sheet) as the thermally-conductive sheet 40.

(Example of Suitable Circuit Module)

Figure 5:
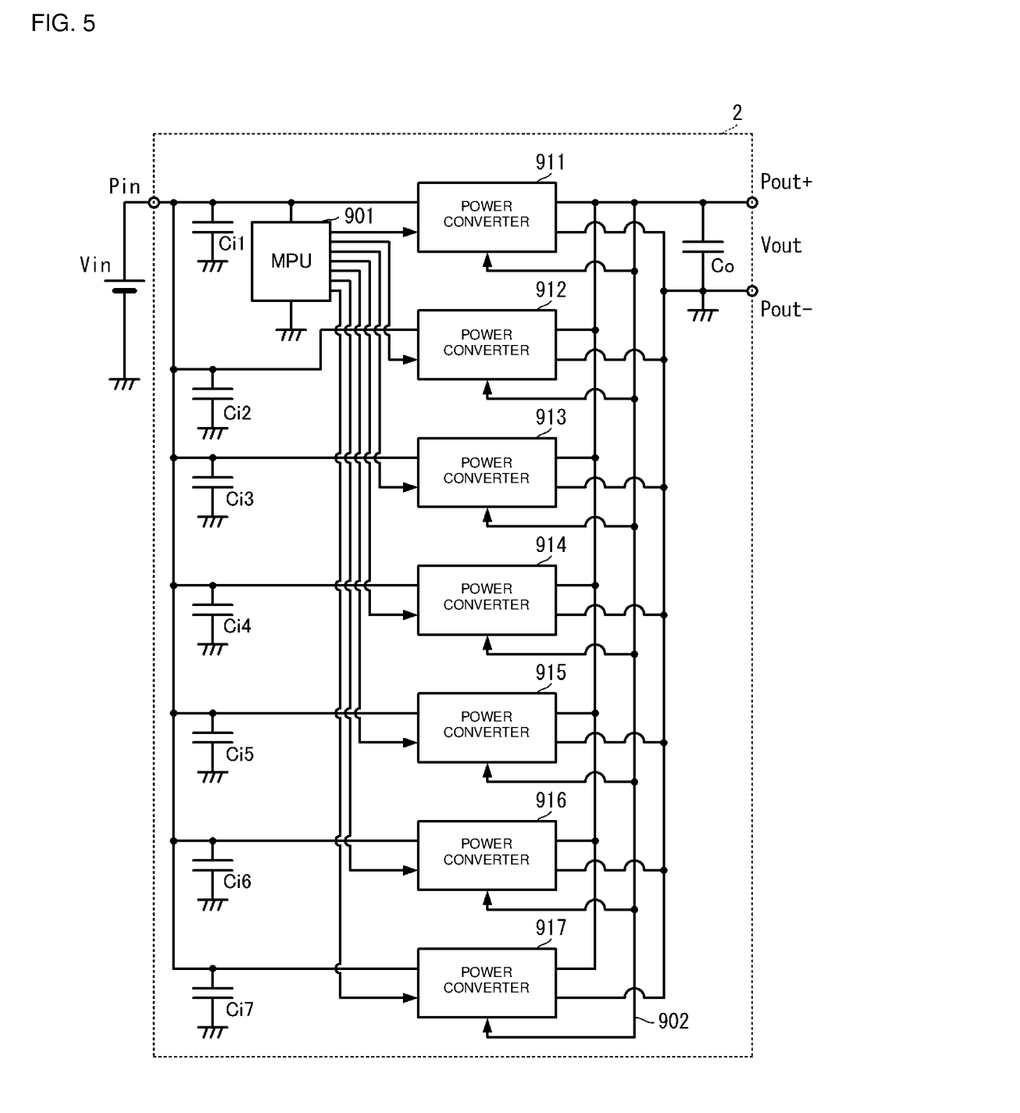
FIG. 5 is an equivalent circuit diagram illustrating, in a simplified manner, a power-supply circuit module to which the circuit board module according to the first embodiment is applied.
Figure 6:
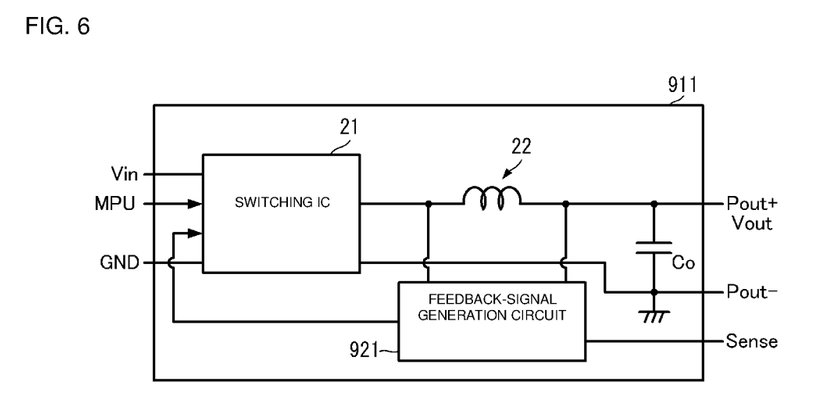
FIG. 6 is an equivalent circuit diagram illustrating a simplified configuration of a power converter of the power-supply circuit module illustrated in FIG. 5.

The circuit board module 10 having a configuration such as that described above can be applied to, for example, an electronic component that will be described below. FIG. 5 is an equivalent circuit diagram illustrating, in a simplified manner, a power-supply circuit module to which the circuit board module according to the first embodiment is applied. FIG. 6 is an equivalent circuit diagram illustrating a simplified configuration of a power converter of the power-supply circuit module illustrated in FIG. 5. Note that descriptions of the specific configuration and the operation of the power-supply circuit module will be omitted.

As illustrated in FIG. 5, a power-supply circuit module 2 includes an MPU 901, a plurality of power converters 911 to 917, a voltage detection circuit 902, and a plurality of input capacitors Ci1 to Ci7. The plurality of power converters 911 to 917 are connected to an input terminal Pin and receives an input voltage Vi from the outside. The input capacitors Ci1 to Ci7 are connected to input ends of the plurality of power converters 911 to 917, respectively. The plurality of power converters 911 to 917 are connected to a pair of terminals that are an output terminal Pout+ and an output terminal Pout−. An output capacitor Co is connected between the output terminal Pout+ and the output terminal Pout−.

The MPU 901 is connected to the input terminal Pin and receives the input voltage Vi. The MPU 901 is connected to the plurality of power converters 911 to 917.

The voltage detection circuit 902 is connected to the output terminal Pout+, and a voltage that is detected by the voltage detection circuit 902 is applied to the plurality of power converters 911 to 917.

The MPU 901 is driven by a drive voltage that is obtained from the input voltage Vi and controls switching of the plurality of power converters 911 to 917 on and off on the basis of the voltage detected by the voltage detection circuit 902. In other words, the MPU 901 controls the number of power converters that are caused to operate in the plurality of power converters 911 to 917 in accordance with the state of a load that is connected to the output terminal Pout. More specifically, for example, when it is desired to increase the current supplied to the load, the MPU 901 increases the number of power converters that are caused to operate, and when the current supplied to the load is excessive, the MPU 901 reduces the number of power converters that are caused to operate.

As a result, the power-supply circuit module 2 can supply the current in accordance with the state of the load. In addition, in this configuration, the plurality of power converters 911 to 917 are connected in parallel with respect to the load, so that the power-supply circuit module 2 can supply a large current to the load with a low voltage.

In such a configuration, the plurality of power converters 911 to 917 have the same configuration that is schematically illustrated in FIG. 6. Note that the power converter 911 will be described below as an example with reference to FIG. 6.

The power converter 911 includes one of the switching ICs 21, one of the inductors 22, a feedback-signal generation circuit 921, and the output capacitor Co.

The switching IC 21 includes a plurality of switching elements and a controller for the switching elements therein. The switching IC 21 operates in response to receiving a clock signal from the MPU 901.

The switching IC 21 is connected to the inductor 22, and the inductor 22 is connected to the output terminal Pout. The output capacitor Co is connected to the output-terminal-Pout side of the inductor 22. The feedback-signal generation circuit 921 generates a feedback signal by using a Sense signal according to an output current and an output voltage and an inductor current and applies the feedback signal to the switching IC 21.

The switching IC 21 controls the output current and the output voltage on the basis of the feedback signal.

In this configuration, the switching IC 21 switches the plurality of switching elements on and off at high speed. This causes the switching IC 21 to generate heat. In other words, the switching IC 21 corresponds to one of the "electronic devices that generate heat when they operate" of the present application. Thus, the configuration of the circuit board module 10 of the present application is more effective.

As described above, the plurality of power converters 911 to 917 supply a large current, and thus, heat that is generated by the switching ICs 21 and the inductors 22 due to the current is also likely to be large. In other words, the switching ICs 21 and the switching ICs 21 correspond to the "electronic devices that generate heat when they operate" of the present application. Thus, the configuration of the circuit board module 10 of the present application is more effective.

(Configuration of Electronic Device to which Circuit Board Module 10 is Applied)

Figure 7:
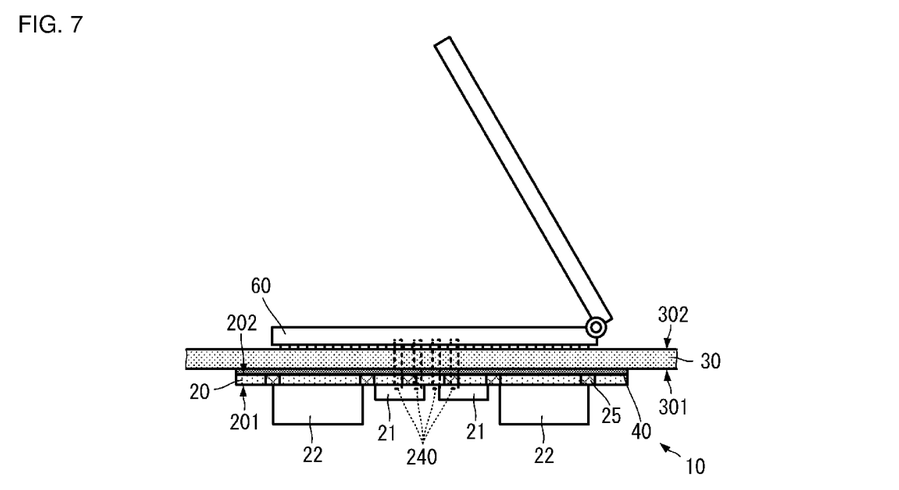
FIG. 7 is a sectional side view illustrating a configuration of a portion of an electronic device to which the circuit board module according to the first embodiment is applied.

The circuit board module 10 having the above-described configuration may be more effective by being applied to, for example, an electronic device such as that partially illustrated in FIG. 7. FIG. 7 is a sectional side view illustrating a configuration of a portion of an electronic device to which the circuit board module according to the first embodiment is applied.

As illustrated in FIG. 7, the electronic device has the configuration of the circuit board module 10 and includes a socket 60. The socket 60 is mounted on the fourth main surface 302 of the circuit board 30. The socket 60 overlaps the circuit board 20 when viewed in plan view. The socket 60 may have has a function of serving as a radiator.

A semiconductor device for data processing such as a CPU or an MPU is attached to the socket 60. The semiconductor device attached to the socket 60 is driven by receiving power supplied by a power-supply circuit module that is fabricated by the circuit board 20 (e.g., the above-described power-supply circuit module 2 illustrated in FIG. 5 and FIG. 6).

Most of CPUs, MPUs, and the like have specifications that require a low voltage and a large current, and in the case of using such a semiconductor device, as mentioned above, the amount of heat generated by the power-supply circuit module is likely to be large. However, by employing the configuration of the circuit board module 10 as described above, effective heat dissipation can be performed. Thus, an adverse effect on the semiconductor device is suppressed, and the reliability of the electronic device is improved. In addition, in this configuration, the height of the circuit board module 10 is small, and thus, an increase in the height of the electronic device can be suppressed even if the power-supply circuit module is disposed on the rear surface of the semiconductor device.

Such a semiconductor device also generates heat when it operates, and thus, for example, a radiator may sometimes be attached to the socket 60. In such a case, if the circuit board 20 is also provided with a radiator, the height of the electronic device will further increase. However, in the configuration of the circuit board module 10, the circuit board 20 does not need a radiator having a large height, and thus, an increase in the height of the electronic device can be suppressed.

The circuit board 20 constructing the power-supply circuit module is disposed in such a manner as to overlap the semiconductor device, so that the distance between the power-supply circuit module and the semiconductor device is reduced. Thus, the efficiency with which the power is supplied from the power-supply circuit module to the semiconductor device is high, and the accuracy and the stability of the voltage that is applied to the semiconductor device are also improved.

In addition, as illustrated in FIG. 7, electrically conductive pins 240 may be attached to the circuit board 20 so as to extend through the circuit board 30 and so as to be connected to the socket 60. As a result, the efficiency with which power is supplied from the circuit board 20 to the semiconductor device is further improved.

Second Embodiment

Figure 8:
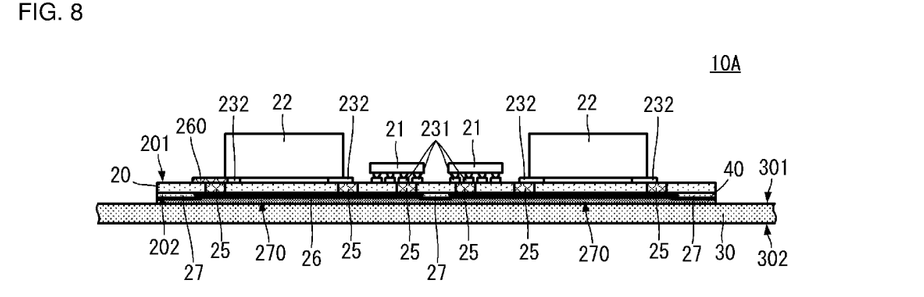
FIG. 8 is a sectional side view of a circuit board module according to a second embodiment.

A circuit board module according to the second embodiment of the present disclosure will now be described with reference to the drawings. FIG. 8 is a sectional side view of the circuit board module according to the second embodiment.

As illustrated in FIG. 8, a circuit board module 10A according to the second embodiment is different from the circuit board module 10 according to the first embodiment in that the circuit board 20 is provided with a ground conductor 26 and an insulating resist film 27, and there is another difference between the circuit board module 10A and the circuit board module 10 relating to these components. The rest of the configuration of the circuit board module 10A is similar to that of the circuit board module 10, and the descriptions of similar portions will be omitted.

The circuit board module 10A includes the ground conductor 26 having a flat film-like shape and the insulating resist film 27. The ground conductor 26 is formed on the second main surface 202 of the circuit board 20. The ground conductor 26 is connected to the plurality of thermally-conductive vias 25.

The resist film 27 is formed so as to cover the ground conductor 26. The resist film 27 has an opening 270. The ground conductor 26 is partially exposed through the opening 270 to the side on which the circuit board 30 is disposed.

The thermally-conductive sheet 40 is formed of a member having electrical conductivity such as a graphite sheet. The thermally-conductive sheet 40 is pressed against the ground conductor 26 as mentioned above so as to be in close contact with the ground conductor 26. In other words, the thermally-conductive sheet 40 and the ground conductor 26 are physically and electrically in contact with each other through the opening 270.

In such a configuration, heat generated by the plurality of switching ICs 21 and the plurality of inductors 22 is dissipated through the plurality of thermally-conductive vias 25, the ground conductor 26, and the thermally-conductive sheet 40.

In addition, in this configuration, the thermally-conductive sheet 40 functions as a noise blocking film. As a result, the circuit board module 10A can reduce the possibility that noise that is generated by an electronic component mounted on the circuit board 20, such as noise that is generated by the plurality of switching ICs 21, will propagate toward the circuit board 30. For example, as described above, in the aspect of the circuit board 30 on which a semiconductor device is mounted, the circuit board module 10A can reduce the possibility that noise that is generated by an electronic component mounted on the circuit board 20 will propagate to the semiconductor device.

In particular, in this configuration, the thermally-conductive sheet 40 has a shape extending over substantially the entire surface of the circuit board 20, and thus, the circuit board module 10A can block noise over a wide area.

Third Embodiment

Figure 9:
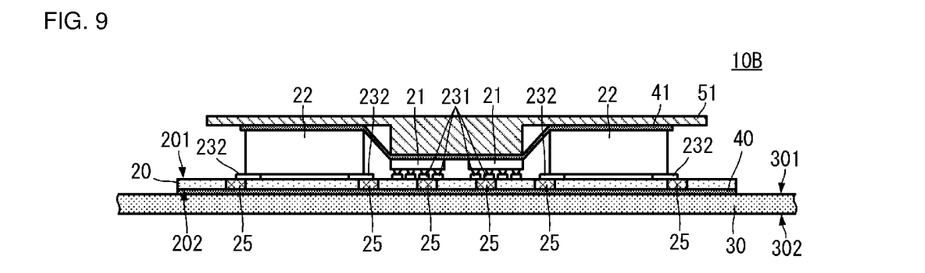
FIG. 9 is a sectional side view of a circuit board module according to a third embodiment.

A circuit board module according to a third embodiment of the present disclosure will now be described with reference to the drawings. FIG. 9 is a sectional side view of the circuit board module according to the third embodiment.

As illustrated in FIG. 9, a circuit board module 10B according to the third embodiment is different from the circuit board module 10 according to the first embodiment in that the circuit board module 10B further includes a thermally-conductive sheet 41 and a heat sink 51. The rest of the configuration of the circuit board module 10B is similar to that of the circuit board module 10, and the descriptions of similar portions will be omitted.

The circuit board module 10B includes the thermally-conductive sheet 41 and the heat sink 51. The thermally-conductive sheet 41 is an insulating sheet made of a silicone rubber or the like. The thermally-conductive sheet 41 is in contact with surfaces of the plurality of switching ICs 21 that are opposite to the mounting surfaces of the plurality of switching ICs 21 and surfaces of the plurality of inductors 22 that are opposite to the mounting surfaces of the plurality of inductors 22. The heat sink 51 is in contact with a surface of the thermally-conductive sheet 41, the surface being opposite to the surface of the thermally-conductive sheet 41 that is in contact with the plurality of switching ICs 21 and the plurality of inductors 22. The thermally-conductive sheet 41 corresponds to a "second thermally-conductive sheet" of the present disclosure.

With such a configuration, the circuit board module 10B can transfer heat to the circuit board 30 through the thermally-conductive sheet 40 and also can dissipate heat through the heat sink 51.

Note that it is preferable that the area of the heat sink 51 be larger than the sum of the total area of the plurality of switching ICs 21 and the total area of the plurality of inductors 22. As a result, the heat dissipation efficiency is further improved.

Figure 10:
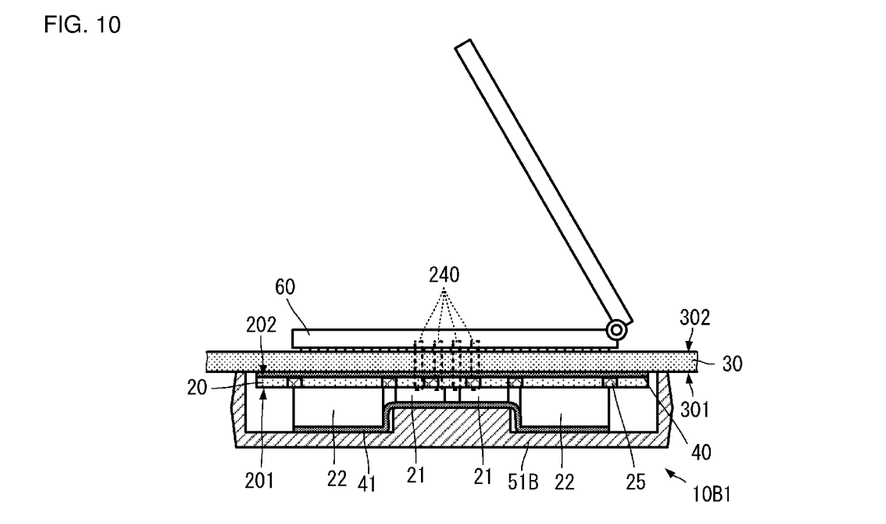
FIG. 10 is a sectional side view illustrating a configuration of a portion of an electronic device to which the circuit board module according to the third embodiment is applied.

The circuit board module 10B having such a configuration can be applied to, for example, an electronic device such as that partially illustrated in FIG. 10. FIG. 10 is a sectional side view illustrating a configuration of a portion of an electronic device to which the circuit board module according to the third embodiment is applied.

The electronic device illustrated in FIG. 10 is different from the electronic device of the first embodiment illustrated in FIG. 7 in that the electronic device illustrated in FIG. 10 includes a back plate 51B for a socket and the above-mentioned thermally-conductive sheet 41. The rest of the configuration of the electronic device illustrated in FIG. 10 is similar to that of the electronic device illustrated in FIG. 7, and the descriptions of similar portions will be omitted.

The back plate 51B is fixed to the third main surface 301 of the circuit board 30. The back plate 51B is disposed in such a manner as to surround the circuit board 20. The back plate 51B is in contact with the plurality of switching ICs 21 and the plurality of inductors 22 with the thermally-conductive sheet 41 interposed therebetween. The back plate 51B is made of a thermally-conductive material similar to the material of the above-mentioned heat sink 51.

With such a configuration, the electronic device illustrated in FIG. 10 can dissipate heat by also using the back plate 51B. In addition, since the back plate 51B is fixed to the circuit board 30, heat can also be transferred to the circuit board 30 from the back plate 51B, so that more effective heat dissipation can be performed.

Fourth Embodiment

Figure 11:
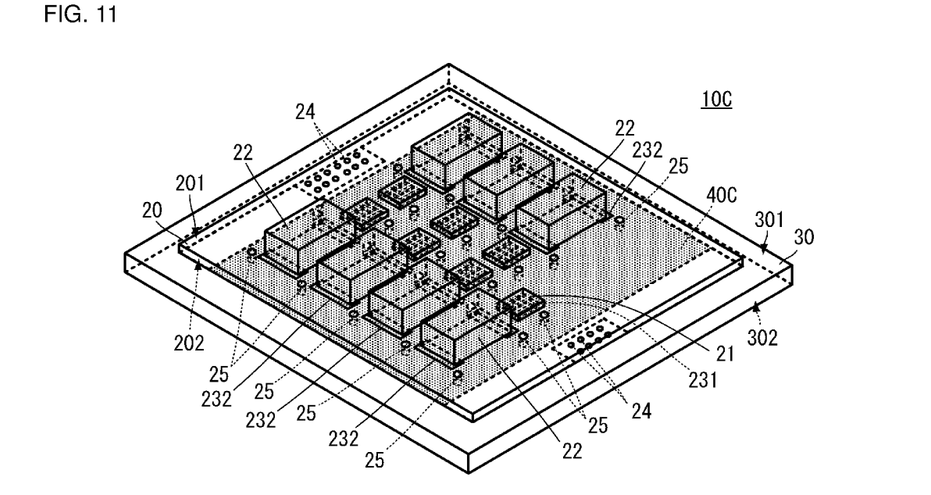
FIG. 11 is an external perspective view of a circuit board module according to a fourth embodiment.

A circuit board module according to a fourth embodiment of the present disclosure will now be described with reference to the drawings. FIG. 11 is an external perspective view of the circuit board module according to the fourth embodiment.

As illustrated in FIG. 11, the difference between a circuit board module 10C according to the fourth embodiment and the circuit board module 10 according to the first embodiment is the shape of a thermally-conductive sheet 40C. The rest of the configuration of the circuit board module 10C is similar to that of the circuit board module 10, and the descriptions of similar portions will be omitted.

The circuit board module 10C includes the thermally-conductive sheet 40C. The area of the thermally-conductive sheet 40C is smaller than the area of the circuit board 20. In this case, the area of the thermally-conductive sheet 40C is larger than the sum of the area of the region in which the plurality of switching ICs 21 are arranged and the area of the region in which the plurality of inductors 22 are arranged. In addition, the thermally-conductive sheet 40C overlaps all the plurality of thermally-conductive vias 25 when viewed in plan view.

With such a configuration, the circuit board module 10C can have a favorable heat-dissipation performance and can be reduced in height.

Fifth Embodiment

Figure 12:
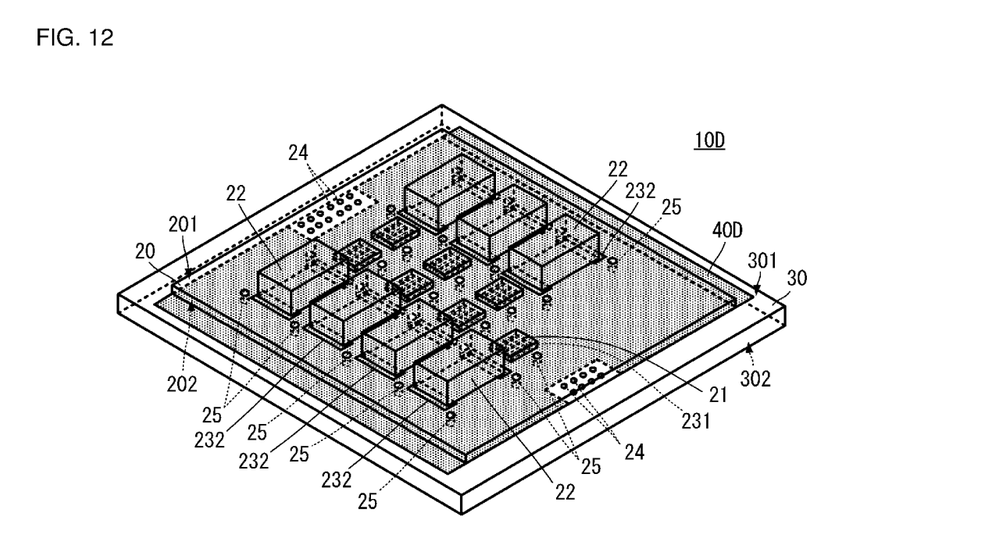
FIG. 12 is an external perspective view of a circuit board module according to a fifth embodiment.

A circuit board module according to a fifth embodiment of the present disclosure will now be described with reference to the drawings. FIG. 12 is an external perspective view of the circuit board module according to the fifth embodiment.

As illustrated in FIG. 12, the difference between a circuit board module 10D according to the fifth embodiment and the circuit board module 10 according to the first embodiment is the shape of a thermally-conductive sheet 40D. The rest of the configuration of the circuit board module 10D is similar to that of the circuit board module 10, and the descriptions of similar portions will be omitted.

The circuit board module 10D includes the thermally-conductive sheet 40D. The area of the thermally-conductive sheet 40D is larger than the area of the circuit board 20.

With such a configuration, the circuit board module 10D can have a favorable heat-dissipation performance and can be reduced in height compared with the circuit board module 10.

Sixth Embodiment

Figure 13:
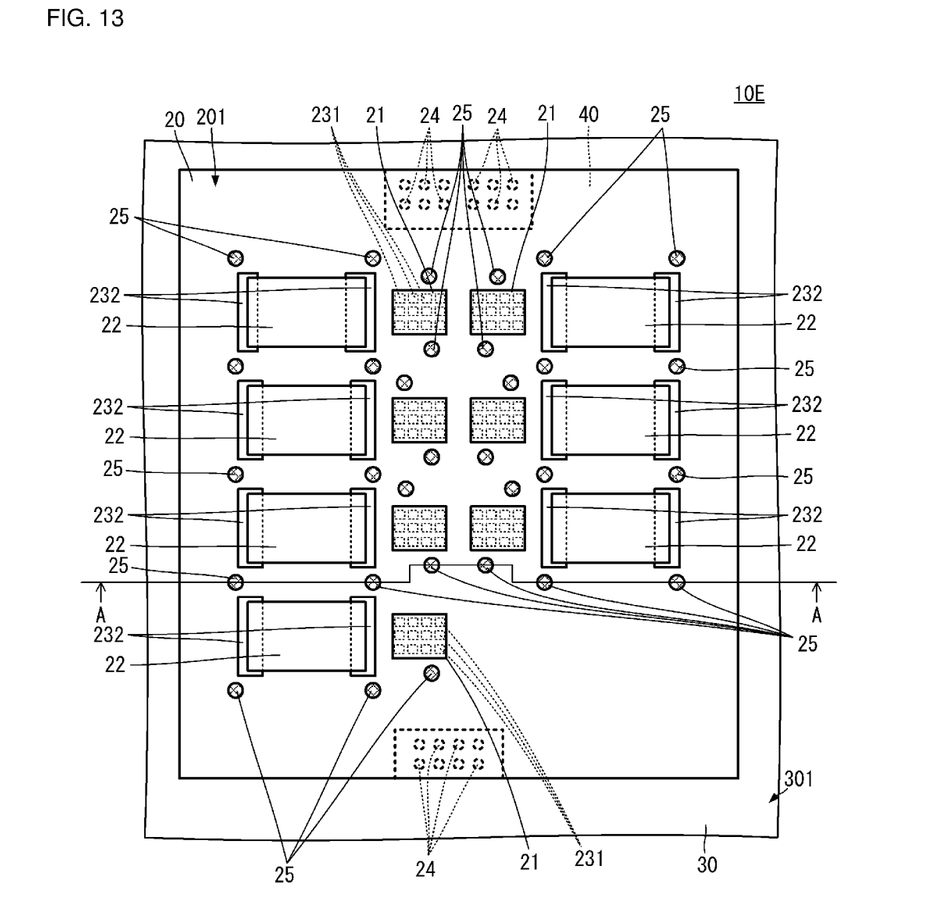
FIG. 13 is a plan view of a circuit board module according to a sixth embodiment.

A circuit board module according to a sixth embodiment of the present disclosure will now be described with reference to the drawings. FIG. 13 is a plan view of the circuit board module according to the sixth embodiment.

As illustrated in FIG. 13, the differences between a circuit board module 10E according to the sixth embodiment and the circuit board module 10 according to the first embodiment are the number of the plurality of thermally-conductive vias 25 arranged and the arrangement pattern of the plurality of thermally-conductive vias 25. The rest of the configuration of the circuit board module 10E is similar to that of the circuit board module 10, and the descriptions of similar portions will be omitted.

In the circuit board module 10E, the number of the thermally-conductive vias 25 that are formed in the vicinity of the plurality of switching ICs 21 is larger than that in each of the other embodiments. With such a configuration, the circuit board module 10E can further improve the heat dissipation efficiency of the plurality of switching ICs 21 which are main heat generation sources.

Note that, in the present embodiment, although the heat dissipation efficiency is partially improved by the number of the plurality of thermally-conductive vias 25, the heat dissipation efficiency can be partially improved by changing the cross-sectional areas of the plurality of thermally-conductive vias 25. In addition, the heat dissipation efficiency can be partially improved by combining the number of the thermally-conductive vias 25 and the cross-sectional areas of the thermally-conductive vias 25.

The configurations in the above-described embodiments can be suitably combined, and each combination can provide an advantageous effect.

What is claimed is:

1. A circuit board module comprising:
a first circuit board having a first main surface on which an electronic component that generates heat when the electronic component operates is mounted and a second main surface;
a second circuit board having a third main surface on which the first circuit board is mounted and a fourth main surface; and
a first thermally-conductive sheet between the first circuit board and the second circuit board,
wherein
the first circuit board is mounted such that the second main surface faces the third main surface of the second circuit board,
the first circuit board includes thermally-conductive vias that extend between the first main surface and the second main surface, the thermally-conductive vias being densely distributed in a region near a mounting terminal of the electronic component and being filled with a thermally-conductive member,
the thermally-conductive vias are physically in contact with the first thermally-conductive sheet,
the first thermally-conductive sheet covers the third main surface of the second circuit board,
every thermally-conductive via included in the first circuit board is spaced apart from the electronic component, when viewed in plan view,
the second main surface of the first circuit board includes an insulating film,
the first thermally-conductive sheet is a graphite sheet, and
the thermally-conductive vias include both vias that conduct electricity through the graphite sheet and vias that are insulated by the insulating film.

2. The circuit board module according to claim 1, wherein
the insulating film has an opening formed at a position that overlaps the thermally-conductive vias, and
the thermally-conductive vias and the first thermally-conductive sheet are physically and electrically in contact with each other through the opening.

3. The circuit board module according to claim 1, further comprising:
a second thermally-conductive sheet that is on the first main surface and that is in contact with the electronic component in such a manner as to cover the electronic component; and
a heat sink that is in contact with the second thermally-conductive sheet in a planar manner.

4. The circuit board module according to claim 3, further comprising:
a radiator that is on the fourth main surface of the second circuit board and that dissipates heat generated by a semiconductor device for data processing that generates heat when it is electrically operated.

5. The circuit board module according to claim 1, wherein
the first thermally-conductive sheet has flexibility.

6. The circuit board module according to claim 1, wherein
the first thermally-conductive sheet has an area larger than a mounting area of the first circuit board in which the electronic component, which generates heat when the electronic component operates, is disposed.

7. The circuit board module according to claim 1, wherein
the first thermally-conductive sheet contains graphite that has a thermal conductivity higher than a thermal conductivity of a metal.

8. The circuit board module according to claim 1, wherein
the first thermally-conductive sheet contains a silicone.

9. The circuit board module according to claim 1, wherein
the electronic component is a power semiconductor, and
wherein a power conversion circuit is configured by the electronic component and the first circuit board.

10. The circuit board module according to claim 2, further comprising:
a second thermally-conductive sheet that is on the first main surface and that is in contact with the electronic component in such a manner as to cover the electronic component; and
a heat sink that is in contact with the second thermally-conductive sheet in a planar manner.

11. The circuit board module according to claim 2, wherein
the first thermally-conductive sheet has flexibility.

12. The circuit board module according to claim 3, wherein
the first thermally-conductive sheet has flexibility.

13. The circuit board module according to claim 2, wherein
the first thermally-conductive sheet has an area larger than a mounting area of the first circuit board in which the electronic component, which generates heat when the electronic component operates, is disposed.

14. The circuit board module according to claim 3, wherein
the first thermally-conductive sheet has an area larger than a mounting area of the first circuit board in which the electronic component, which generates heat when the electronic component operates, is disposed.

15. The circuit board module according to claim 2, wherein
the first thermally-conductive sheet contains graphite that has a thermal conductivity higher than a thermal conductivity of a metal.

16. The circuit board module according to claim 3, wherein
the first thermally-conductive sheet contains graphite that has a thermal conductivity higher than a thermal conductivity of a metal.

17. The circuit board module according to claim 2, wherein
the first thermally-conductive sheet contains a silicone.

18. The circuit board module according to claim 3, wherein
the first thermally-conductive sheet contains a silicone.

19. The circuit board module according to claim 2, wherein
the electronic component is a power semiconductor, and
wherein a power conversion circuit is configured by the electronic component and the first circuit board.

20. The circuit board module according to claim 3, wherein
the electronic component is a power semiconductor, and
wherein a power conversion circuit is configured by the electronic component and the first circuit board.

21. The circuit board module according to claim 1, wherein
the first circuit board includes a ground conductor having a flat film-like shape, and
the first circuit board can reduce the possibility that noise that is generated by an electronic component mounted on the first circuit board will propagate toward the second circuit board.

* * * * *